US008250434B2

(12) United States Patent
Yang et al.

(10) Patent No.: US 8,250,434 B2
(45) Date of Patent: Aug. 21, 2012

(54) SYSTEMS AND METHODS FOR CODEC USAGE CONTROL DURING STORAGE PRE-READ (75) Inventors: Shaohua Yang, Santa Clara, CA (US); Yuan Xing Lee, San Jose, CA (US); Changyou Xu, Fremont, CA (US); Richard Rauschmayer, Longmont, CO (US); Harley Burger, San Jose, CA (US); Kapil Gaba, Fremont, CA (US)

(73) Assignee: LSI Corporation, Milpitas, CA (US)

( * ) Notice: Subject to any disclaimer, the term of this patent is extended or adjusted under 35 U.S.C. 154(b) by 554 days.

(21) Appl. No.: 12/487,638

(22) Filed: Jun. 18, 2009

(65) Prior Publication Data
US 2010/0322048 A1 Dec. 23, 2010

(51) Int. Cl.
*H03M 13/00* (2006.01)

(52) U.S. Cl. .................................................... 714/758

(58) Field of Classification Search .................. 714/758, 714/756, 752, 799, 702, 760, 795; 375/262, 375/341
See application file for complete search history.

(56) References Cited

U.S. PATENT DOCUMENTS

| | | | |
|---|---|---|---|
| 5,278,846 A * | 1/1994 | Okayama et al. ............ 714/755 |
| 5,325,402 A | 6/1994 | Ushirokawa | |
| 5,392,299 A | 2/1995 | Rhines et al. | |
| 5,513,192 A | 4/1996 | Janku et al. | |
| 5,612,964 A | 3/1997 | Haraszti | |
| 5,701,314 A | 12/1997 | Armstrong et al. | |
| 5,717,706 A | 2/1998 | Ikeda | |
| 5,844,945 A | 12/1998 | Nam et al. | |
| 5,898,710 A | 4/1999 | Amrany | |
| 5,923,713 A | 7/1999 | Hatakeyama | |
| 5,978,414 A | 11/1999 | Nara | |
| 5,983,383 A | 11/1999 | Wolf | |
| 6,005,897 A | 12/1999 | McCallister et al. | |
| 6,023,783 A | 2/2000 | Divsalar et al. | |
| 6,029,264 A | 2/2000 | Kobayashi et al. | |
| 6,041,432 A | 3/2000 | Ikeda | |
| 6,097,764 A | 8/2000 | McCallister et al. | |
| 6,216,251 B1 | 4/2001 | McGinn | |
| 6,266,795 B1 | 7/2001 | Wei | |
| 6,317,472 B1 | 11/2001 | Choi et al. | |

(Continued)

FOREIGN PATENT DOCUMENTS
WO    WO 2006/016751    2/2006
(Continued)

OTHER PUBLICATIONS

Collins and Hizlan, "Determinate State Convolutional Codes" IEEE Transactions on Communications, Dec 1993.
(Continued)

*Primary Examiner* — Phung M Chung
(74) *Attorney, Agent, or Firm* — Hamilton, DeSanctis & Cha (57) ABSTRACT

Various embodiments of the present invention provide systems and methods for data processing. For example, a data processing circuit is disclosed that includes an increased iteration enable signal, a first detector circuit, a second detector circuit, and a data decoding circuit. The first detector circuit receives a data set and performs a data detection on the data set to provide a detected data set. The data decoding circuit receives a derivative of the detected data set and performs a decoding process to provide a decoded data set. The decoded data set is provided to the second detector circuit based at least in part on an assertion level of the increased iteration enable signal.

20 Claims, 5 Drawing Sheets

U.S. PATENT DOCUMENTS

| | | |
|---|---|---|
| 6,351,832 B1 | 2/2002 | Wei |
| 6,377,610 B1 | 4/2002 | Hagenauer et al. |
| 6,438,717 B1 | 8/2002 | Butler et al. |
| 6,473,878 B1 | 10/2002 | Wei |
| 6,625,775 B1 | 9/2003 | Kim |
| 6,671,404 B1 | 12/2003 | Kawatani et al. |
| 6,748,034 B2 | 6/2004 | Hattori et al. |
| 6,757,862 B1 | 6/2004 | Marianetti, II |
| 6,772,384 B1* | 8/2004 | Noguchi ............ 714/755 |
| 6,788,654 B1 | 9/2004 | Hashimoto et al. |
| 6,810,502 B2 | 10/2004 | Eidson et al. |
| 6,986,098 B2 | 1/2006 | Poeppelman et al. |
| 7,010,051 B2 | 3/2006 | Murayama et al. |
| 7,047,474 B2 | 5/2006 | Rhee et al. |
| 7,058,873 B2 | 6/2006 | Song et al. |
| 7,093,179 B2 | 8/2006 | Shea |
| 7,184,486 B1 | 2/2007 | Wu et al. |
| 7,191,378 B2 | 3/2007 | Eroz et al. |
| 7,203,887 B2 | 4/2007 | Eroz et al. |
| 7,257,764 B2 | 8/2007 | Suzuki et al. |
| 7,310,768 B2 | 12/2007 | Eidson et al. |
| 7,646,829 B2* | 1/2010 | Ashley et al. ............ 375/340 |
| 2004/0098659 A1 | 5/2004 | Bjerke et al. |
| 2005/0216819 A1 | 9/2005 | Chugg et al. |
| 2005/0273688 A1 | 12/2005 | Argon |
| 2006/0020872 A1 | 1/2006 | Richardson et al. |
| 2006/0031737 A1 | 2/2006 | Chugg et al. |
| 2006/0140311 A1 | 6/2006 | Ashley et al. |
| 2006/0168493 A1* | 7/2006 | Song ............ 714/752 |
| 2006/0195772 A1 | 8/2006 | Graef et al. |
| 2006/0248435 A1 | 11/2006 | Haratsch |
| 2007/0011569 A1 | 1/2007 | Vila Casado et al. |
| 2007/0047635 A1 | 3/2007 | Stojanovic et al. |
| 2007/0286270 A1 | 12/2007 | Huang et al. |
| 2008/0049825 A1 | 2/2008 | Chen et al. |
| 2008/0168330 A1 | 7/2008 | Graef et al. |
| 2009/0273492 A1* | 11/2009 | Yang et al. ............ 341/81 |
| 2009/0276689 A1* | 11/2009 | Tan et al. ............ 714/799 |
| 2010/0070837 A1* | 3/2010 | Xu et al. ............ 714/799 |
| 2010/0275096 A1* | 10/2010 | Zhong et al. ............ 714/758 |

FOREIGN PATENT DOCUMENTS

| | | |
|---|---|---|
| WO | WO 2006/091797 | 8/2007 |

OTHER PUBLICATIONS

Eleftheriou, E. et al., "Low Density Parity Check Codes for Digital Subscriber Lines", Proc ICC 2002, pp. 1752-1757.

Han and Ryan, "Pinning Techniques for Low-Floor Detection/Decoding of LDPC-Coded Partial Response Channels", 5th International Symposium on Turbo Codes & Related Topics, 2008.

Mohsenin et al., "Split Row: A Reduced Complexity, High Throughput LDPC Decoder Architecture", pp. 1-6, printed from www.ece.ucdavis.edu on Jul. 9, 2007.

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Yeo et al., "VLSI Architecture for Iterative Decoders in Magnetic Storage Channels", Mar. 2001, pp. 748-755, IEEE trans. Magnetics, vol. 37, No. 2.

Zhong et al., "Area-Efficient Min-Sum Decoder VLSI Architecture for High-Rate QC-LDPC Codes in Magnetic Recording", pp. 1-15, Submitted 2006, not yet published.

Zhong et al., "Design of VLSI Implementation-Oriented LDPC Codes", IEEE, pp. 670-673, 2003.

Zhong et al., "High-Rate Quasi-Cyclic LDPC Codes for Magnetic Recording Channel with Low Error Floor", ISCAS, IEEE pp. 3546-3549, May 2006.

Zhong et al., "Iterative MAX-LOG-MAP and LDPC Detector/Decoder Hardware Implementation for Magnetic Read Channel", SRC TECHRON, pp. 1-4, Oct. 2005.

Zhong et al., "Joint Code-Encoder Design for LDPC Coding System VLSI Implementation", ISCAS, IEEE pp. 389-392, May 2004.

Zhong et al., "Quasi Cyclic LDPC Codes for the Magnetic Recording Channel: Code Design and VSLI Implementation", IEEE Transactions on Magnetics, v. 43, pp. 1118-1123, Mar. 20, 2007.

Zhong, "VLSI Architecture of LDPC Based Signal Detection and Coding System for Magnetic Recording Channel", Thesis, RPI, Troy, NY, pp. 1-95, May 2006.

Zhong, "Block-LDPC: A Practical LDPC Coding System Design Approach", IEEE Trans. On Circuits, Regular Papers, vol. 5, No. 4, pp. 766-775, Apr. 2005.

Casado et al., Multiple-rate low-density parity-check codes with constant blocklength, IEEE Transations on Communications, Jan. 2009, vol. 57, pp. 75-83.

* cited by examiner

SYSTEMS AND METHODS FOR CODEC USAGE CONTROL DURING STORAGE PRE-READ

BACKGROUND OF THE INVENTION

The present inventions are related to systems and methods for accessing information from a storage medium, and more particularly to systems and methods for focusing processing power on particular portions of information accessed from the storage medium.

Figure 1:
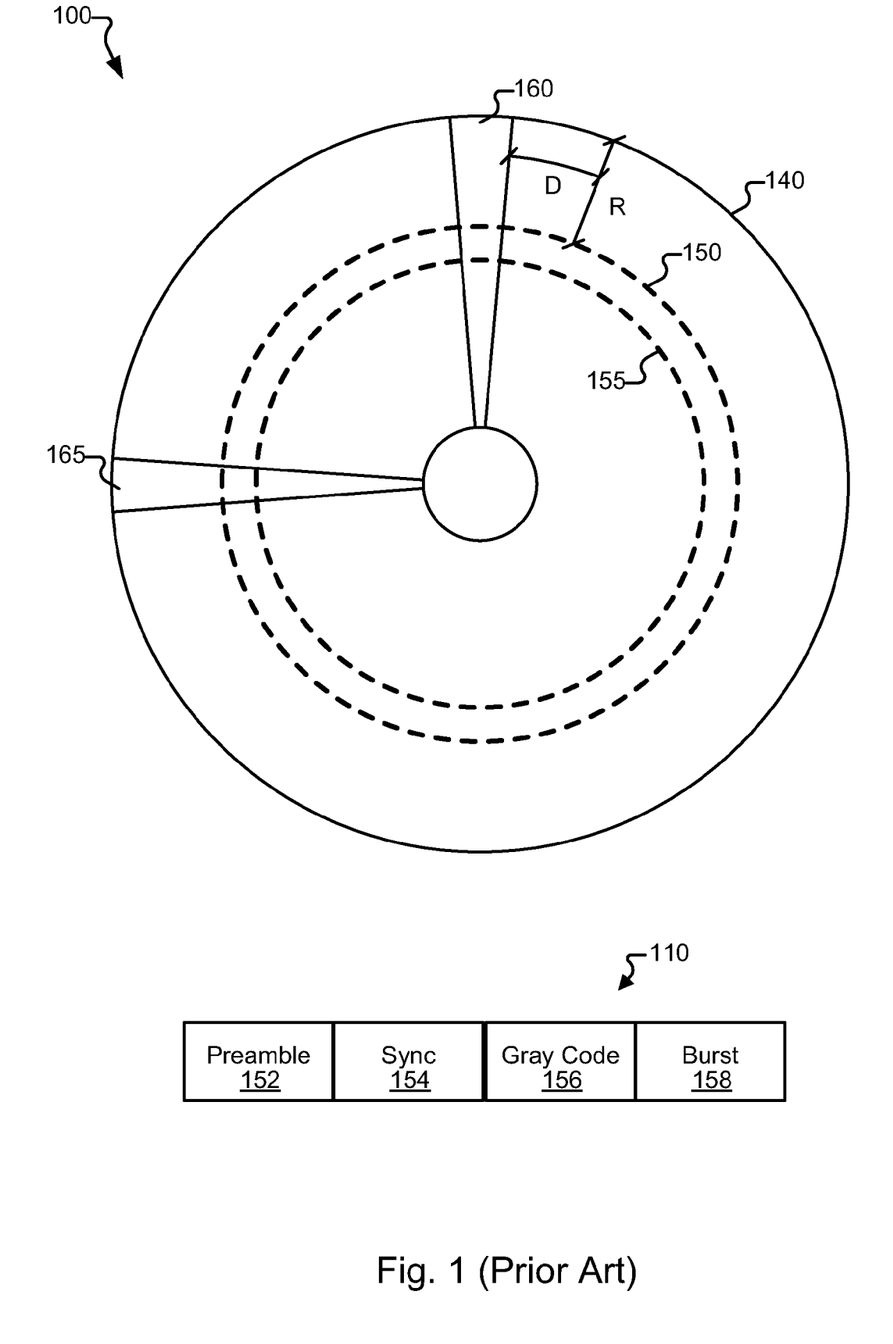
FIG. 1 shows a prior art storage medium.

A typical storage device includes a storage medium where information is stored that may be retrieved at a later point. As an example, a hard disk drive may include a storage medium 100 implemented as a disk platter. FIG. 1 shows two exemplary tracks 150, 155 on storage medium 100 as dashed lines and written respective distances from an outer perimeter 140. The tracks are segregated by servo data written within wedges 160, 165. These wedges include data and supporting bit patterns that are used for control and synchronization of the head assembly over a desired storage location on storage medium 100. In particular, such wedges traditionally include a preamble pattern followed by a single sector address mark (SAM) as shown by element 110. The SAM is followed by a Gray code, and the Gray code is followed by burst information. It should be noted that while two tracks and two wedges are shown, hundreds of each would typically be included on a given storage medium. Further, it should be noted that a sector may have two or more bursts.

In a typical scenario, a sensing head is positioned over a track where a desired set of information resides. Once positioned, storage medium 100 is moved relative to the sensing head as sectors are continuously read from storage medium 100. The accessed information is being provided to a processing circuit. The processing circuit makes the same processing power available to process each set of data accessed from the storage medium. Such an approach, however, may not allow sufficient processing power for more difficult and/or important data sets, and may apply too much processing power to less difficult and/or important data sets. This results alternatively potential processing failures or excess power utilization.

Hence, for at least the aforementioned reasons, there exists a need in the art for advanced systems and methods for obtaining data from potentially defective media.

BRIEF SUMMARY OF THE INVENTION

The present inventions are related to systems and methods for accessing information from a storage medium, and more particularly to systems and methods for focusing processing power on particular portions of information accessed from the storage medium.

Various embodiments of the present invention provide data processing circuits that include an increased iteration enable signal, a first detector circuit, a second detector circuit, and a data decoding circuit. The first detector circuit receives a data set and performs a data detection on the data set to provide a detected data set. The data decoding circuit receives a derivative of the detected data set and performs a decoding process to provide a decoded data set. The decoded data set is provided to the second detector circuit based at least in part on an assertion level of the increased iteration enable signal. In some instances of the aforementioned embodiments, the assertion level of the increased iteration enable signal is a first assertion level. In such cases, the decoded data set is directed away from the second detector circuit and provided as an output based at least in part on a second assertion level of the increased iteration enable signal. In some instances of the aforementioned embodiments, directing the decoded data set away from the second detector circuit limits a number of processor iterations applied to the decoded data set. In some cases, the output is provided to a reorder buffer. In such cases, directing the decoded data set away from the second detector circuit may reduce the amount of storage in the reorder buffer that is utilized.

In some instances of the aforementioned embodiments, the data processing circuit further includes an iteration enable control circuit. The iteration enable control circuit is operable to identify the data set of interest and to assert the increased iteration enable signal at the first assertion level based upon identification of the data set of interest. In some cases, the aforementioned data set is a data set of interest, the aforementioned detected data set is a detected data set of interest, and the aforementioned decoded data set is decoded data set of interest.

In some such cases, the data processing circuit further includes an excess data set that precedes the data set of interest. The iteration enable control circuit is operable to assert the increased iteration enable signal at a second assertion level based upon failure to identify the data set of interest. The first detector circuit receives the excess data set and performs a data detection on the excess data set to provide an excess detected data set. The data decoding circuit receives a derivative of the excess detected data set, and performs a decoding process on the excess detected data set to provide an excess decoded data set. The excess decoded data set is directed away from the second detector circuit and provided as an output based at least in part on the second assertion level of the increased iteration enable signal. Directing the excess decoded data set away from the second detector circuit may limit a number of processor iterations applied to the excess decoded data set. Further, the output may be provided to a reorder buffer. In such cases, directing the excess decoded data set away from the second detector circuit may reduce the amount of storage in the reorder buffer that is utilized. In one or more cases, reducing the amount of storage in the reorder buffer that is utilized assures additional processing iterations for processing the excess decoded data set.

Various other embodiments of the present invention provide methods for data processing that include providing a first detector circuit and a second detector circuit. A data detection on an input data set is performed by the first detector circuit from which detected data is generated. A derivative of the detected data set is decoded and a decoded data set is generated. It is then determined whether the input data set is a data set of interest, and based at least in part on said determination of a data set of interest, the decoded data set is provided to the second detector circuit for an additional processing iteration. In some cases, the detected data set is interleaved, and the interleaved data set is the aforementioned derivative of the detected data set.

In various instances of the aforementioned embodiments, the detected data set is a detected data set of interest, the decoded data set is a decoded data set of interest, and the input data set is a data set of interest. In such cases, a data detection is performed on an excess data set using the first detector to generate an excess detected data set. A decoding process is performed on a derivative of the excess detected data set to generate a decoded data set. It is determined whether the excess data set is not a data set of interest, and based at least in part on said determination that the excess data set is not a data set of interest, the excess decoded data set is provided as an output regardless of whether the excess decoded data set converged. In some cases, interleaving is performed on the excess detected data set to generate an excess interleaved data set. In such cases, the excess interleaved data set is generated is the derivative of the excess detected data set. In some such cases, providing the excess decoded data set as an output regardless of whether the excess decoded data set converged may limit a number of processor iterations applied to the excess decoded data set. In various cases, the output is provided to a reorder buffer. In such cases, providing the excess decoded data set as an output regardless of whether the excess decoded data set converged may reduce the amount of storage in the reorder buffer that is utilized.

Yet other embodiments of the present invention provide data processing systems that include a first detector circuit, a second detector circuit, a data decoder, and an output data buffer. The first detector circuit is operable to perform a data detection on an excess data set at a first time to generate an excess detected data set, and on a data set of interest at a second time to generate a detected data set of interest. The data decoder is operable to receive a derivation of the excess detected data set and to provide a corresponding excess decoded data set, and to receive a derivation of the detected data set of interest and to provide a corresponding decoded data set of interest. The data decoder provides the decoded data set of interest for processing by the second detector circuit at a third time, and the data decoder provides the excess decoded data set to an output data buffer regardless of convergence of the excess decoded data set. In some instances of the aforementioned embodiments, the data decoder provides the decoded data set of interest to an output data buffer upon convergence of the decoded data set of interest.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several drawings to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for accessing information from a storage medium, and more particularly to systems and methods for focusing processing power on particular portions of information accessed from the storage medium.

Figure 2:
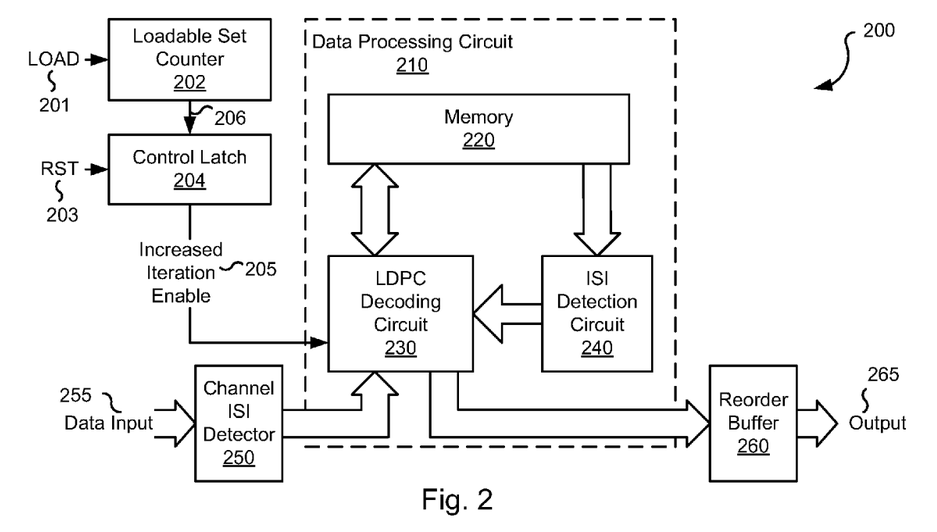
FIG. 2 shows a data processing codec including sector of interest control circuitry in accordance with one or more embodiments of the present invention.

Turning to FIG. 2, a data processing codec 200 including sector of interest control circuitry is shown in accordance with one or more embodiments of the present invention. Data processing codec 200 includes a data processing circuit 210 and circuitry that generates a increased iteration enable signal 205. Increased iteration enable signal 205 is provided as a control signal to data processing circuit 210 to limit the number of processing iterations allowed for some data sets to assure that a relatively large number of processing iterations can be applied to a data set of interest. The phrases "data set of interest", "data set of focus" and "sector of interest" are each interchangeably used herein in their broadest sense to mean a set of data that for one reason or another holds particular interest. Thus, for example, a data set of interest may be a data set that includes particular information requested in a read operation. Based upon the disclosure provided herein, one of ordinary skill in the art will recognize a variety of indicia for a data set of interest.

In a read operation, an amount of data surrounding the requested data may be read and processed. This is done as the data surrounding the requested data is easily retrieved when accessing the requested data, and is commonly accessed around the same time as the requested data. The excess data may be maintained in a read buffer accessible to the requesting device, and as such may result in a decrease in access latency and/or a reduction in power usage by a storage device. As described herein, data sets preceding the data set including the requested data are referred to as pre-read data sets and data sets following the data set including the requested data are referred to as post-read data sets. Pre-read data sets and post-read data sets are commonly referred to herein as extra data sets. Various embodiments of the present invention include capability for directing a larger amount of processing power to a data set of interest than to excess data sets. In the case of a hard disk drive, the data sets may be sectors of data maintained on the storage medium.

Excess data sets may be distinguished from data sets of interest through use of a loadable set counter 202 and a control latch 204. In particular, loadable set counter 202 is loaded with the number of pre-read data sets preceding the data set of interest that are to be processed and stored in a read buffer along with the data set of interest. A load value 201 is programmed into loadable set counter 202, and the value in the counter is decremented each time a data set within the defined range of the data set of interest is received and processed. Once the count is decremented to zero, an enable signal 206 is asserted. Enable signal 206 is latched using by a control latch that may be reset by assertion of a reset signal 203. Control latch provides the latched value as increased iteration enable signal 205 to data processing circuit 210.

Data processing circuit 210 includes an LDPC (i.e., a low density parity check decoder) decoding circuit 230 and an inter-symbol interference detection circuit 240 that are combined such that a number of iterations of any given data set can be performed. In particular, a data input 255 may be originally processed by a channel inter-symbol interference detection circuit 250 as is known in the art. The resulting processed data set is provided either directly or indirectly to LDPC decoding circuit 230 where a decoding algorithm is applied to the data set. It is determined whether the processing resulted in convergence of the data set. Where the decoding did result in convergence, the converged data set is provided to a reorder buffer 260. Once a sequence of data sets are available in reorder buffer 260, the sequence of data sets is provided as an output 265. Reorder buffer 260 provides an ability to apply additional processing iterations to one or more data sets while allowing a succeeding data set to converge after a reduced number of processing iterations.

Where a data set fails to converge after processing by LDPC decoder circuit 230, the non-converged data set is written to a memory 220. The non-converged data set may be retrieved from memory 220 and processed by inter-symbol interference detection circuit 240. The resulting re-processed data set is provided back to LDPC decoding circuit 230 where the decoding algorithm is again applied. In theory, the number of processing iterations (i.e., inter-symbol interference detection and LDPC decoding passes) that may be applied to a given data set is infinite, and processing would continue until convergence is achieved. In practice, however, the number of iterations is limited by the size of reorder buffer 260 and memory 220. Thus, there is some finite limit on the number of processing iterations that may be applied to a given data set. Further, this number of iterations is limited by the convergence or lack of convergence of data sets preceding the given data set.

As an example, memory 220 may be large enough to hold up to five non-converged data sets. Where memory 220 is full and the currently received data set fails to converge after processing by LDPC decoding circuit 230, the oldest data set is provided to reorder buffer 260 regardless of its failure to converge. Thus, each data set is guaranteed at least two iterations (one iteration through channel inter-symbol interference detection circuit 250 and LDPC decoding circuit 230, and the second iteration through inter-symbol interference detection circuit 240 and LDPC decoding circuit 230) before being forced out into reorder buffer 260. As such, LDPC decoder 230 is capable of processing two data sets in the time required to receive one new data set. In contrast, inter-symbol interference detection circuit 240 and channel inter-symbol interference detection circuit 250 are each capable of processing a single data set in the time required to receive one new data set.

In some cases, one data set is of greater interest than other data sets (e.g., the data set of interest). In such cases, increased iteration enable signal 205 may be asserted and de-asserted to assure that a relatively large number of processing iterations are available for the data set of greatest interest. In particular, increased iteration enable 205 may be de-asserted when an excess data set is being processed. With increased iteration enable 205 de-asserted, only one iteration through channel inter-symbol interference detector circuit 250 and LDPC decoder 230 is allowed. As such, memory 220 and reorder buffer 260 remain substantially empty. In contrast, when a data set of interest is received, increased iteration enable 205 is asserted. With increased iteration enable 205 asserted, LDPC decoding circuit 230 is able to write the processed data set to memory 220 where it fails to converge. As memory 220 and reorder buffer 260 are substantially empty, the data set of interest is allowed the maximum number of iterations through inter-symbol interference detector circuit 240 and LDPC decoder 230 before an output to reorder buffer 260 is forced.

As an example, where reorder buffer 260 is capable of holding sixteen processed data sets, a data set of interest can be guaranteed eight processing iterations before it must be provided to reorder buffer 260 for reordering and output if all other neighboring data sets require only one processing iteration. In contrast, where preceding data sets that fail to converge are allowed to be written to memory 220 and subsequently re-processed leaving memory 220 and reorder 260 potentially full, a data set of interest may only be guaranteed two processing iterations before being forced out to reorder buffer 260. By selectively applying processing power, maximum processing can be assured to a selected data set at the expense of processing power devoted to data sets that ultimately may not be needed.

Figure 3:
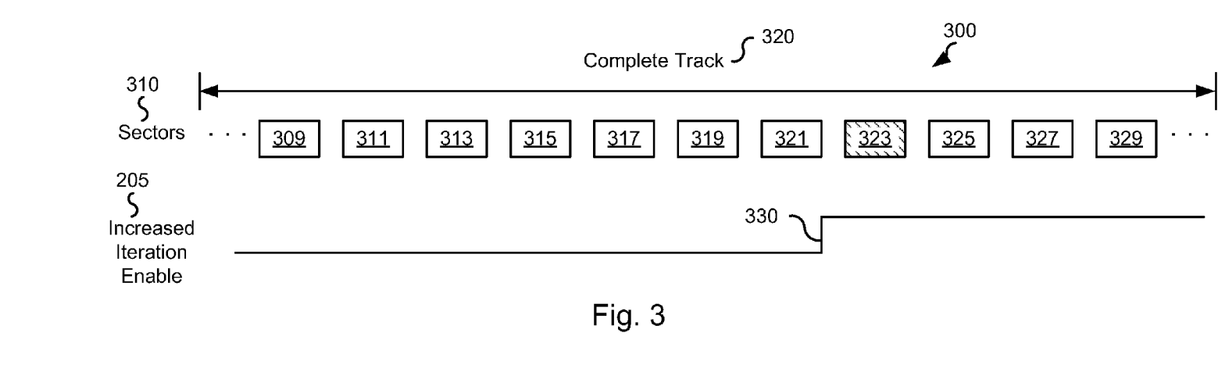
FIG. 3 is a timing diagram showing control of a data processing codec based upon a selected sector of interest in accordance with various embodiments of the present invention.

Turning to FIG. 3, a timing diagram 300 shows assertion of increased iteration enable signal 205 in relation to processing sectors 310 retrieved from a disk storage medium in accordance with various embodiments of the present invention. As shown, a number of sectors 310 are sequentially accessed from the disk storage medium (i.e., sectors 309, 311, 313, 315, 317, 319, 321, 323, 325, 327, 329). The accessed sectors come from a common track 320. Sector 323 indicated by a distinct pattern is a sector of interest, and as such it is desired to afford additional processing iterations at the expense of pre-read sectors (i.e., sectors 309, 311, 313, 315, 317, 319, 321). As such, increased iteration enable signal 205 is asserted after sector 321 is received and prior to the completion of processing of sector 323 through LDPC decoding circuit 230. By de-asserting increased iteration enable signal 205 prior to sector 323, memory 220 and reorder buffer 260 are emptied. By asserting increased iteration enable signal 205 at a time when memory 220 and reorder buffer 260 are substantially empty, the processing iterations afforded sector 323 are not limited due to the failure of sectors 309, 311, 313, 315, 317, 319, 321 to converge. This results in maximization of processing iterations available of sector 323.

Figure 4:
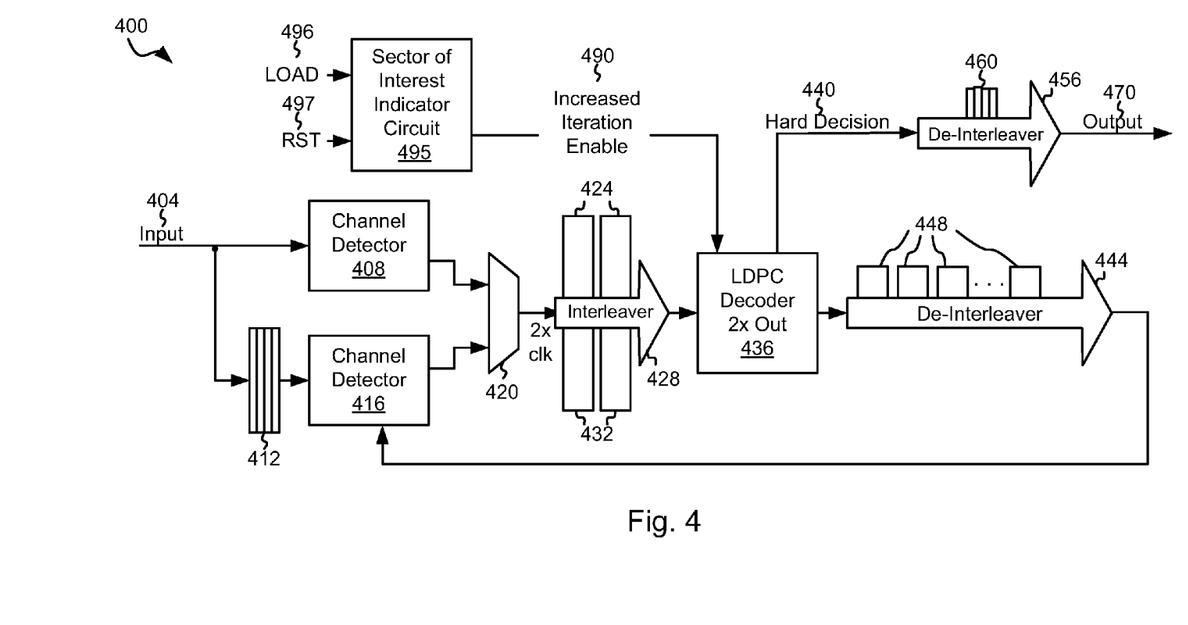
FIG. 4 depicts a data processing codec including sector of interest control input in accordance with various embodiments of the present invention.

Turning to FIG. 4, a particular implementation of a data processing codec 400 including a sector of interest indicator circuit 495 is shown in accordance with various embodiments of the present invention. Data processing codec 400 includes a data input 404 that is fed to a channel detector 408. Channel detector 408 may be any type of channel detector known in the art including, but not limited to, a soft output Viterbi algorithm detector (SOVA) or a maximum a posteriori (MAP) detector. Based on the disclosure provided herein, one of ordinary skill in the art will recognize a variety of channel detectors that may be used in accordance with different embodiments of the present invention. In addition, data input 404 is provided to a input data buffer 412 that is designed to hold a number of data sets received from data input 404. In some embodiments of the present invention, such data sets are a sector of data from a storage medium. The size of input data buffer 412 may be selected to provide sufficient buffering such that a data set input via data input 404 remains available at least until a first iteration processing of that same data set is complete and the processed data is available in a ping pong buffer 448 (i.e., a queuing buffer) as more fully described below. Input data buffer 412 provides the data sets to a channel detector 416. Similar to channel detector 408, channel detector 416 may be any type of channel detector known in the art including, but not limited to, a SOVA detector or a MAP detector. Again, based on the disclosure provided herein, one of ordinary skill in the art will recognize a variety of channel detectors that may be used in accordance with different embodiments of the present invention.

The output of both channel detector 408 and channel detector 416 are provided to an interleaver circuit 428 via a multiplexer 420. Such outputs may be, for example, log likelihood ratio values. Interleaver circuit 428 interleaves the output of channel detector 408 and separately interleaves the output of channel detector 416 using two ping pong buffers 424, 432. One of the buffers in ping pong buffer 424 holds the result of a prior interleaving process of the output from channel detector 408 and is unloaded to an LDPC decoder 436, while the other buffer of ping pong buffer 424 holds a data set from channel detector 408 that is currently being interleaved. Similarly, one of the buffers in ping pong buffer 432 holds the result of a prior interleaving process of the output from channel detector 416 and is unloaded to LDPC decoder 436, while the other buffer of ping pong buffer 424 holds a data set from channel detector 416 that is currently being interleaved.

A sector of interest indicator circuit 495 is operable to assert/de-assert a increased iteration enable signal 490 when a data set that is the focus of processing (e.g., the sector of interest) is received. In some implementations, data preceding the data set of focus is processed and stored to a read buffer along with the data set of focus (e.g., the sector of interest). However, there may be a desire to assure a greater degree of processing power for the data set of focus. In such cases, sector of interest indicator circuit 495 counts the pre-read data sets that are received while maintaining increased iteration enable signal 490 de-asserted, and once the count reaches a point indicating the data set of focus, sector of interest indicator circuit 495 asserts increased iteration enable signal 490. In one implementation, a LOAD value 496 is provided to a down-counter that is included as part of sector of interest indicator circuit 495. LOAD value 496 represents the number of data sets to be pre-read prior to the data set of focus. Each time a data set is received and processed, the down-counter is decremented. Once the down counter reaches zero, the data set of focus is indicated and increased iteration enable 490 is asserted. Increased iteration enable 490 remains asserted until a reset signal 497 is asserted in preparation for the next time processing is to be limited to assure that a data set of interest receives the maximum possible iterations. Increased iteration enable 490 is provided to an LDPC decoder 436.

LDPC decoder 436 is capable of decoding one or more data sets simultaneously. As an example, LDPC decoder 436 may be designed to decode an interleaved data set from ping pong buffer 424, or an interleaved data set from ping pong buffer 432, or to decode interleaved data sets from ping pong buffer 424 and ping pong buffer 432 simultaneously. The decoded data is either provided as a hard decision output 440 and/or to a de-interleaver circuit 444 that uses ping pong buffer 448 to de-interleave the decoded data and to provide the de-interleaved data as an input to channel detector 416. One of the buffers in ping pong buffer 448 holds the result of a prior de-interleaving process and is unloaded to channel detector 416, while the other buffer of ping pong buffer 448 holds a decoded data set currently being de-interleaved. Hard decision output 440 is provided to a de-interleaver circuit 456 that de-interleaves hard decision output 440 and stores the de-interleaved result in an output data buffer 460. Ultimately, de-interleaver circuit 456 provides the de-interleaved data stored in output data buffer 460 as an output 470.

Hard output 440 is provided from LDPC decoder 436 whenever the data processed by LDPC decoder 436 converges, whenever there is insufficient buffering in output data buffer 460, or whenever increased iteration enable 490 is de-asserted. By de-asserting increased iteration enable 490 when processing data sets preceding the data set of focus, the preceding data sets are allowed only one iteration through LDPC decoder 436 before being provided as hard output 440. In this way, maximum processing iterations can be reserved for the data set of focus as the number of buffers in output data buffer 460 may be used to assure that the data set of focus can be taken as far out of order as possible. As such, the data set of focus is assured additional iterations through channel detector 416 and LDPC decoder 436, thus increasing the possibility of convergence for at least the data set of focus.

It should be noted that while the preceding embodiment is described as allowing only a single iteration through channel detector 408 and LDPC decoder 436 for pre-read data sets, that other possibilities remain. For example, the maximum number of iterations possible for a given data set is a function of the number of buffers in output data buffer 460 and the inability for preceding data sets to converge. Thus, there is a possibility that the data set of focus may receive the maximum number of iterations where necessary regardless of the previously described force out process brought on by assertion of increased iteration enable where the pre-read data sets are each converging in one or two iterations. Thus, in some embodiments of the present invention, de-assertion of increased iteration enable 490 may only force LDPC decoder 436 to provide hard output 440 on the first iteration of a pre-read data set where pre-read data sets are not converging to the extent that output data buffer 460 is not substantially empty. In this way, a data set of interest will be guaranteed a place in ping pong buffer 448, but won't necessarily truncate processing of all pre-read data sets. Based upon the disclosure provided herein, one of ordinary skill in the art will recognize a variety of modifications to the discussed embodiments of the present invention that will allow for maximizing processing power to a data set of focus at times at the expense of processing power allotted to pre-read data sets.

In operation, a first data set is introduced via data input 404 to channel detector 408. Channel detector 408 performs its channel detection algorithm and provides both a hard output and a soft output to multiplexer 420. The hard and soft decision data is written to one buffer of ping pong buffer 424. At the same time the detector output is written into the buffer, interleaver 428 interleaves the data set by writing consecutive data into non-consecutive memory/buffer addresses based on the interleaver algorithm/mapping. Once interleaver 428 completes its interleaving process, the interleaved data is decoded by LDPC decoder 436. Where the data converges, LDPC decoder 436 writes its output as hard decision output 440 to output data buffer 460 and the processing is completed for that particular data set. Alternatively, where the data does not converge, LDPC decoder 436 writes its output (both soft and hard) to ping pong buffer 448. Depending upon the failure of earlier data sets to converge, output data buffer 460 may not always have available space to assure more than two iterations through channel detector and LDPC decoder. As more fully described below, the scheduling guarantees that there is at least one empty buffer in ping pong buffer 448 for holding this new set of data, and this strategy assures that each data input is guaranteed the possibility of at least two global iterations (i.e., two passes through a detector and decoder pair).

It may be desired, however, that a data set be guaranteed a larger number of global iterations. This larger number can be guaranteed by de-asserting increased iteration enable 490 prior to a data set of focus. In this condition, data sets processed by LDPC decoder 436 are not allowed into ping pong buffer 448, but are rather forced out has hard output 440 after a single iteration through channel detector 408 and LDPC decoder 436. This limits the amount of out of order processing that is being done, and thus allows output data buffer 460 to become substantially empty prior to processing of the data set of focus. Increased iteration enable 490 is asserted coincident with receiving the data set of focus. Upon assertion LDPC decoder 436 is able to write the processed data set of focus to ping pong buffer 448 that is at that time substantially empty. This assures that where the data set of focus fails to converge, that it may be maintained in ping pong buffer 448 for a maximum number of processing iterations through channel detector 416 and LDPC decoder 436. This provides an increased possibility that processing of the data set of interest will ultimately converge.

The data written to ping pong buffer 448 is fed back to channel detector 416. Channel detector 416 selects the data set that corresponds to the output in ping pong buffer 348 from input data buffer 412 and performs a subsequent data detection aided by the soft output data generated by LDPC decoder 436 fed back from ping pong buffer 448. By using the previously generated soft data for data maintained in input data buffer 412, channel detector 416 generally performs a subsequent channel detection with heightened accuracy. The output of this subsequent channel detection is passed to interleaver 428 via multiplexer 420. The data is written to one buffer of ping pong buffer 432, and interleaver 428 interleaves the data. The interleaved data is then passed to LDPC decoder 436 where it is decoded a second time. Similar to the first iteration, a decision is made as to whether the data converged or whether there is insufficient space in ping pong buffer 448 to handle the data. Where such is the case, LDPC decoder 436 writes its output as hard decision output 440 to output data buffer 460 and the processing is complete for that particular data set. Alternatively, where the data does not converge and there is sufficient buffer space in ping pong buffer 448 to receive an additional data set, writes its output (both soft and hard) to ping pong buffer 448 where it is passed back to channel detector 416 for a third pass. Sufficient space is defined in ping pong buffer 448 by having at least reserved space for the data set from the first detector and decoder after the data set from the second detector and decoder is written into the ping pong buffer.

It should be noted that, as an example, a first data set may be applied at data input 404 and that it takes a number of iterations to converge while all subsequent data sets applied at data input 404 converge on the first pass (i.e., on a single iteration). In such a case, the first data set may be processed a number of times (i.e., a number of iterations) that is limited by the amount of memory available in output data buffer 460. Once output data buffer 460 is full or once an ordered set of outputs are available, the most recent hard decision output corresponding to the first data set is provided as a hard decision output and de-interleaver 456 re-orders the outputs putting the first output in the first position. With this done, output data buffer 460 are flushed out as output 470. In some embodiments of the present invention, de-interleaver 456 does not perform a re-ordering function and output data buffer 460 has a very limited size. In such a case, it is conceivable that a data set could be processed a very large number times (i.e., a large number of iterations) only limited by how long a recipient of output 470 is willing to wait for the data. As another example, it is possible that all data applied as data input 404 converges on its first pass. In such a case, channel detector 416, LDPC decoder 436 and/or de-interleaver 444 may be placed in a power saving mode to conserve power. As yet another example, it may be the case that all data sets applied at data input 404 fail to converge on the first pass (i.e., a single iteration). In such a case, all data sets would be iterated twice. It should also be noted that one or more additional channel detectors may be added along with additional space in ping pong buffers 424, 432, 448 that would facilitate more iterations in the situation where a significant number of closely located data sets fail to converge. In such cases, all data sets can be guaranteed to be decoded with number of iterations the same as the number of detectors.

Based on the disclosure provided herein, it will be appreciated that data processing codec 400 allows for performance of a variable number of detection and decoding iterations depending upon the introduced data. Further, in some cases, considerable power savings may be achieved through use of data processing codec 400. Yet further, in some cases, a faster LDPC decoder may be implemented allowing for an increased throughput where substantial first iteration data convergence exists as multiple iterations are not necessarily required. Yet further, by allowing results of LDPC decoder 436 to be reported out of order, upstream processing does not have to wait for the completion of downstream processing. Re-ordering of the out of order results may be done by queuing detection/decoding circuit 400 or by a downstream recipient of output 470.

It should be noted that a similar preemption process assuring additional processing iterations for a data set of focus may be applied to other data processing codecs. For example, a sector of interest indicator circuit generating a increased iteration enable signal may be applied to the data processing codecs disclosed in U.S. patent Ser. No. 12/114,462 entitled "Systems and Methods for Queue Based Data Detection and Decoding", and filed May 2, 2008 by Yang et al. The entirety of the aforementioned patent application is incorporated herein by reference for all purposes.

Figure 5A:
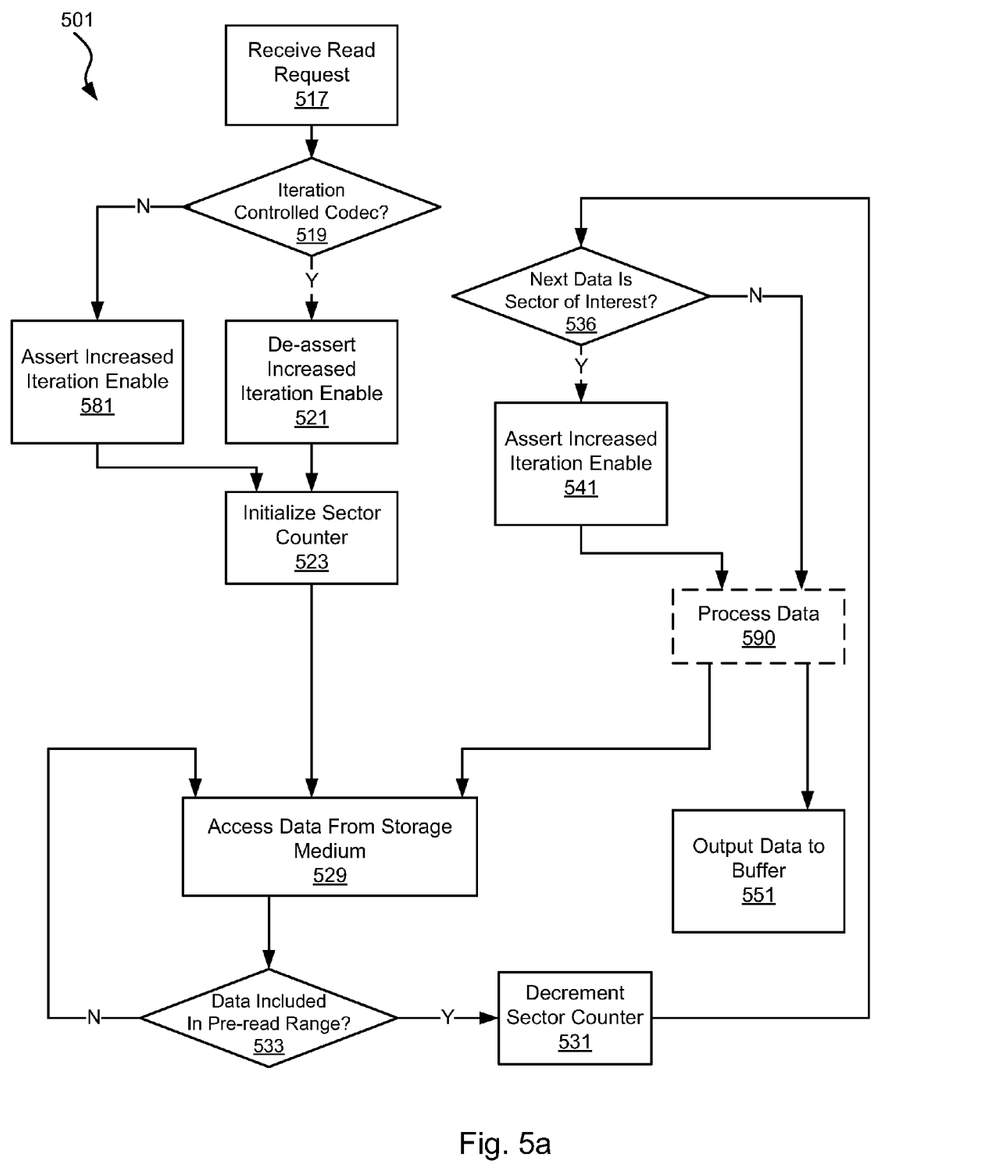
FIGS. 5a-5b are flow diagrams showing a process for modifying processing power to account for sectors of interest in accordance with some embodiments of the present invention.

Turning to FIG. 5a, a flow diagram 501 shows a method in accordance with some embodiments of the present invention for controlling the processing that may be applied to a given data set. Following flow diagram 501, a read request is received (block 517). The read request may include, for example, identification of a particular data set that is to be retrieved. It is determined whether iteration control is to be applied to the requested read (block 519). Such iteration control may be used to maximize the processing power applied to the requested data set by reducing the amount of processing allowed for other data sets retrieved in the same read process. Iteration control may be selected by a user depending upon a particular selection. Where iteration control is desired (block 519), a increased iteration enable signal is de-asserted (block 521). Alternatively, where iteration control is not desired (block 519), a increased iteration enable signal is asserted (block 581). Whether iteration control is desired or not (block 519), a sector counter is initialized to count pre-read data sets retrieved and processed prior to the requested data set (block 523). The loaded sector count indicates the number of pre-read data sets to be stored to a memory buffer. Data from the storage medium is then accessed (block 529). This may be done, for example, by positioning a read/write head assembly over a storage medium at a location near the region to be read.

It is determined whether the accessed data is within pre-read range of the requested data (block 533). As an example, it may be desired to read two sectors before and two sectors after a sector including the requested data. Where it is not within the pre-read range (block 533), minimal location processing is performed to determine the location of the next sector and accessing the next sector from the storage medium (block 529).

Alternatively, where the data accessed is included in the pre-read range (block 533), the previously initialized sector counter is decremented (block 531). It is then determined whether the received data set includes the requested data (block 536). Where the current data set does not include the requested data (block 536), the data set is processed (block 590) using the current assertion of the maximum enable signal (see blocks 521, 581). In some cases, the data set of interest is identified where the sector counter is decremented to zero. As shown in greater detail in FIG. 5b, the processing of block 590 proceeds depending upon the assertion level of the increased iteration enable signal. Once processing is completed (block 590), the processed data set is written to a data buffer (block 551). The processed data remains in the data buffer accessible to the process or circuit that originally requested the read. In addition, the next data set is accessed from the storage medium (block 529).

Where on the other hand the accessed data set is the data set of interest (block 536), the increased iteration enable signal is asserted (block 541). The data set is processed (block 590) using the new assertion of the maximum enable signal (see block 541). Again, as shown in greater detail in FIG. 5b, the processing of block 590 proceeds depending upon the assertion level of the increased iteration enable signal. Once processing is completed (block 590), the processed data set is written to a data buffer (block 551). The processed data remains in the data buffer accessible to the process or circuit that originally requested the read. In addition, the next data set is accessed from the storage medium (block 529).

Figure 5B:
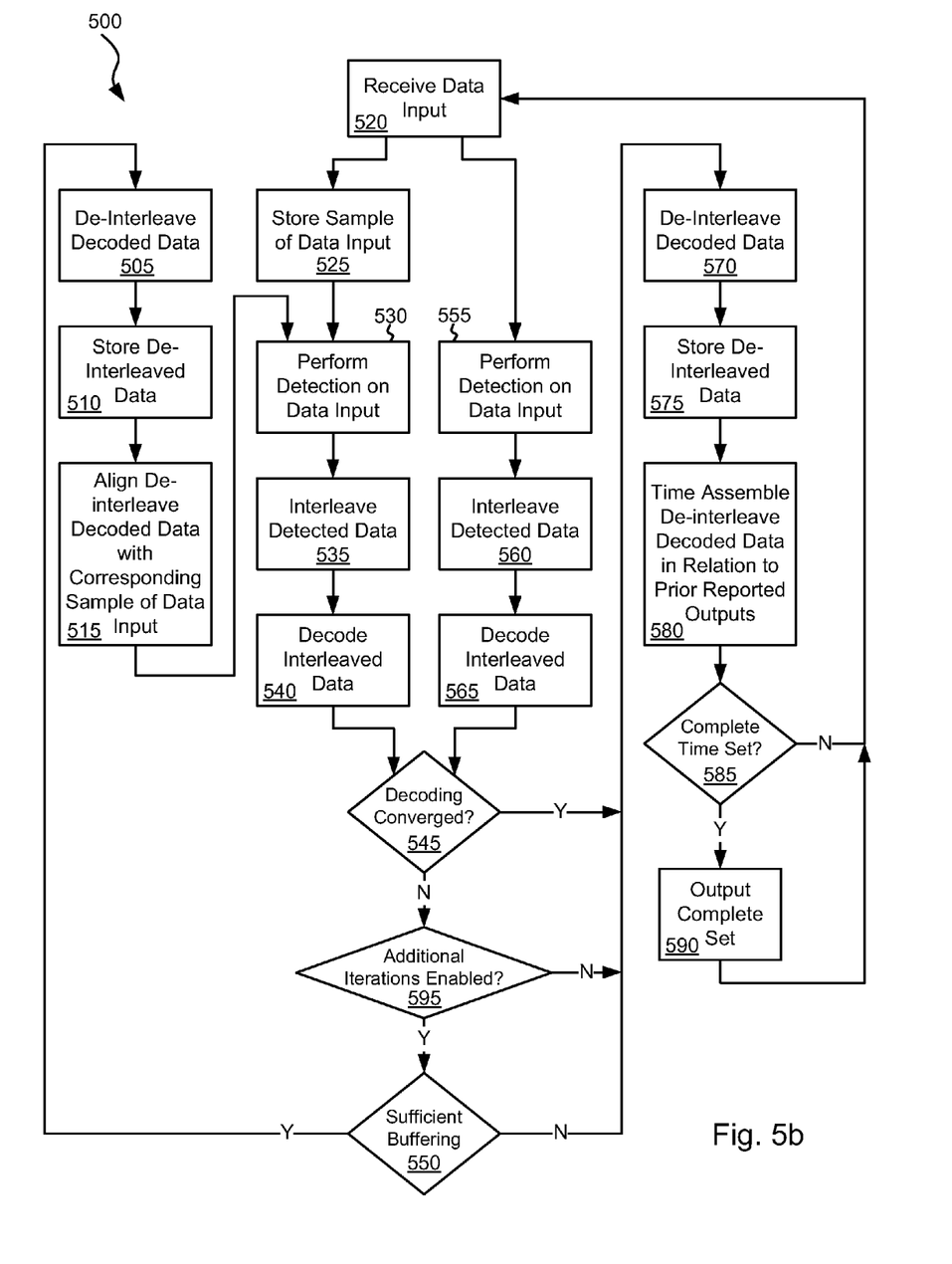

Turning to FIG. 5b, a flow diagram 500 depicts a method in accordance with some embodiments of the present invention for performing variable iterative detection and decoding processes including preservation of maximum detection and decoding iterations for a data set of interest. Following flow diagram 500, a data input is received (block 520). This data input may be, but is not limited to, a series of data bits received from a magnetic storage medium or a series of bits received from a transmission channel. Based on the disclosure provided herein, one of ordinary skill in the art will recognize a variety of sources and formats for the received data input. A sample of the received data is stored in a buffer and retained for later processing (block 525). Data detection processes are performed on the received data (block 555), the detected data is interleaved (block 560), and the interleaved data is decoded (block 565). It is then determined whether the decoding process converged (block 545). Where it is determined that the decoding process converged, the processed data set is passed on for final processing steps.

Alternatively, where it is determined that the decoding process failed to converge (block 545), it is further determined whether additional iterations are enabled for the data set currently being processed (block 595). Additional iterations may be enabled, for example, for data sets of interest and not for other pre-read data sets. Additional iterations may be indicated, for example, by assertion of an enable signal provided to a data processing codec. In some cases, the data sets may each comprise one or more sectors of data, and the other pre-read data sets may be sectors both preceding and succeeding the sectors of interest on the same track. Where additional iterations are not enabled (block 595), the processed data set is passed on for final processing steps.

Alternatively, where additional iterations are enabled (block 595), it is determined whether there is sufficient buffering available to allow additional iterations for exiting non-converged codewords (block 550). This may be determined based upon, for example, whether output buffer 460 is full. By enabling additional iterations only for data sets of interest (block 595), it is possible to assure that sufficient buffering will be available where a data set of interest fails to converge. Where there is insufficient buffering available (block 550), the processed data set is passed on for final processing steps.

Alternatively, where there is sufficient buffering available (block 550) the process of detection and decoding is repeated on the previously processed data set. In particular, the decoded data is de-interleaved (block 505) and the resulting de-interleaved data is stored to a buffer (block 510). Once the data detector is available, the de-interleaved data is aligned with the corresponding sample of the data input (block 515). The de-interleaved data and the corresponding sample data input is provided to the data detector where a subsequent data detection is performed (block 530) on the originally stored sample of data input (block 525) using the soft input developed in the earlier processing of the same data input (blocks 555, 560, 565, 545, 550, 505, 510, 515). The result of the data detection process is interleaved (block 535) and the interleaved data is decoded (block 540). At this point, it is determined whether the data detection and decoding process is to be repeated (blocks 505, 510, 515, 530, 535, 540) or whether final processing steps are to be carried out.

Where either the decoding process converged (block 545), additional iterations are not enabled (block 595), or there is insufficient buffering available (block 550), the final processing steps are completed. The final processing includes de-interleaving the decoded data (block 570) and storing the de-interleaved data to a buffer (block 575). The buffer includes various results that may have become available out of order, and as such the various results are reordered in the buffer to represent the order in which the corresponding data input was originally received (block 580). It is then determined if a complete time set is available in the buffer (block 585). A complete time set includes every result corresponding to received inputs over a given period of time. Thus, for example, where the first result is delayed while two later results are reported, the complete time set exists for the three results once the first result is finally available in the buffer. It should be noted that in some embodiments of the present invention that the results are reported out of order to a recipient. In such cases, there is no need to reorder results or to determine whether complete time sets are available. Where a complete time set is available (block 585) or where the results are to be reported as they are received without regard to order, the result(s) are output to a recipient (block 590).

Figure 6:
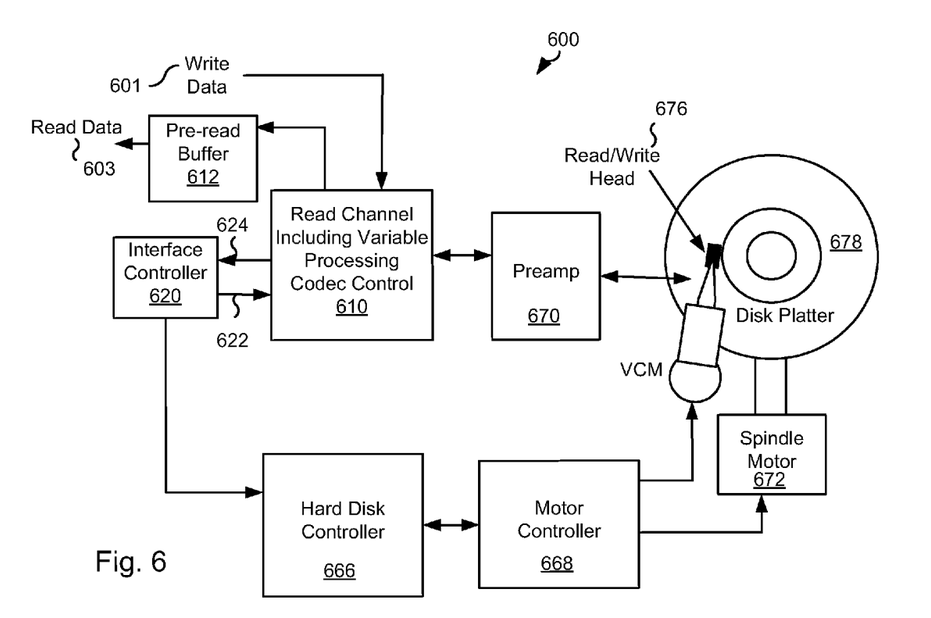
FIG. 6 shows a storage system with variable data processing codec in accordance with various embodiments of the present invention.

Turning to FIG. 6, a storage system 600 including read channel 610 with a variable data processing codec in accordance with various embodiments of the present invention. Storage system 600 may be, for example, a hard disk drive. The variable data processing codec included as part of read channel 610 may be, but is not limited to either of the codecs described above in relation to FIG. 2 or FIG. 4. In some cases, the variable data processing codec included as part of read channel 610 may operate using the method described above in relation to FIGS. 5a-5b.

Storage system 600 also includes a preamplifier 670, an interface controller 620, a hard disk controller 666, a motor controller 668, a spindle motor 672, a disk platter 678, and a read/write head 676. Interface controller 620 controls addressing and timing of data to/from disk platter 678. The data on disk platter 678 consists of groups of magnetic signals that may be detected by read/write head assembly 676 when the assembly is properly positioned over disk platter 678. In one embodiment, disk platter 678 includes magnetic signals recorded in accordance with a perpendicular recording scheme. For example, the magnetic signals may be recorded as either longitudinal or perpendicular recorded signals.

In a typical read operation, read/write head assembly 676 is accurately positioned by motor controller 668 over a desired data track on disk platter 678. The appropriate data track is defined by an address received via interface controller 620. Motor controller 668 both positions read/write head assembly 676 in relation to disk platter 678 and drives spindle motor 672 by moving read/write head assembly to the proper data track on disk platter 678 under the direction of hard disk controller 666. Spindle motor 672 spins disk platter 678 at a determined spin rate (RPMs). Once read/write head assembly 678 is positioned adjacent the proper data track, magnetic signals representing data on disk platter 678 are sensed by read/write head assembly 676 as disk platter 678 is rotated by spindle motor 672. The sensed magnetic signals are provided as a continuous, minute analog signal representative of the magnetic data on disk platter 678. This minute analog signal is transferred from read/write head assembly 676 to read channel 610 via preamplifier 670. Preamplifier 670 is operable to amplify the minute analog signals accessed from disk platter 678. In turn, read channel module 610 decodes and digitizes the received analog signal to recreate the information originally written to disk platter 678.

The read data is provided to a pre-read buffer 612, and may be accessed from pre-read buffer 612 as read data 603. Pre-read buffer 612 may be any memory such as, for example a DRAM that is capable of buffering more data than was actually requested. Such a pre-read buffer allows for requesting a particular set of data stored on disk platter 678, but receiving substantial data surrounding the requested set of data. As one data request may frequently be followed by subsequent data requests for data around that earlier requested, such an approach of over-reading and storing the excess data to pre-read buffer 612 may limit the number to times read/write head assembly 676 must be repositioned in relation to disk platter 678, and/or may reduce the latency of subsequent data accesses. During a read, focus may be placed on one or more particular data sets maintained on disk platter 678. By placing this focus, processing power may be reserved to maximize the number of processing iterations that remain available for processing the data sets identified as being of particular interest. This helps to assure that the particular data sets converge. A write operation is substantially the opposite of the preceding read operation with write data 601 being provided to read channel module 610. This data is then encoded and written to disk platter 678.

In conclusion, the invention provides novel systems, devices, methods and arrangements for reading data from a storage medium. While detailed descriptions of one or more embodiments of the invention have been given above, various alternatives, modifications, and equivalents will be apparent to those skilled in the art without varying from the spirit of the invention. Further, techniques discussed herein may be applied to analog to digital converters as well. Therefore, the above description should not be taken as limiting the scope of the invention, which is defined by the appended claims.

What is claimed is:

1. A data processing circuit, wherein the data processing circuit comprises:
    an increased iteration enable signal;
    a first detector circuit, wherein the first detector circuit is operable to receive a data set and performs a data detection on the data set to provide a detected data set;
    a data decoding circuit, wherein the data decoding circuit is operable to receive a derivative of the detected data set and to perform a decoding process to provide a decoded data set; and
    wherein the decoded data set is provided to a second detector circuit based at least in part on an assertion level of the increased iteration enable signal.

2. The data processing circuit of claim 1, wherein the assertion level of the increased iteration enable signal is a first assertion level, and wherein the decoded data set is directed away from the second detector circuit and provided as an output based at least in part on a second assertion level of the increased iteration enable signal.

3. The data processing circuit of claim 2, wherein directing the decoded data set away from the second detector circuit limits a number of processor iterations applied to the decoded data set.

4. The data processing circuit of claim 2, wherein the output is provided to a reorder buffer, and wherein directing the decoded data set away from the second detector circuit is operable to reduce the amount of storage in the reorder buffer that is utilized.

5. The data processing circuit of claim 1, wherein the assertion level of the increased iteration enable signal is a first assertion level, and wherein the data processing circuit further comprises:
    an iteration enable control circuit, wherein the iteration enable control circuit is operable to identify the data set of interest and to assert the increased iteration enable signal at the first assertion level based upon identification of the data set of interest.

6. The data processing circuit of claim 5, wherein the data set is a data set of interest, wherein the detected data set is a detected data set of interest, wherein the decoded data set is decoded data set of interest, and wherein the data processing circuit further comprises:
    an excess data set, wherein the excess data set precedes the data set of interest;
    wherein the iteration enable control circuit is operable to assert the increased iteration enable signal at a second assertion level based upon failure to identify the data set of interest;
    wherein the first detector circuit is operable to receive the excess data set and to perform a data detection on the excess data set to provide an excess detected data set;
    wherein the data decoding circuit is operable to receive a derivative of the excess detected data set and to perform a decoding process on the derivative excess detected data set to provide an excess decoded data set; and
    wherein the excess decoded data set is directed away from the second detector circuit and provided as an output based at least in part on the second assertion level of the increased iteration enable signal.

7. The data processing circuit of claim 6, wherein directing the excess decoded data set away from the second detector circuit limits a number of processor iterations applied to the excess decoded data set.

8. The data processing circuit of claim 6, wherein the output is provided to a reorder buffer, and wherein directing the excess decoded data set away from the second detector circuit reduces the amount of storage in the reorder buffer that is utilized.

9. The data processing circuit of claim 8, wherein reducing the amount of storage in the reorder buffer that is utilized assures additional processing iterations for processing the excess decoded data set.

10. A method for data processing, the method comprising:
    providing a first detector circuit and a second detector circuit;
    performing a data detection on an input data set using the first detector, wherein a detected data set is generated;
    decoding a derivative of the detected data set, wherein a decoded data set is generated;
    determining whether the input data set is a data set of interest;
    based at least in part on said determination of a data set of interest, providing the decoded data set to the second detector circuit for an additional processing iteration.

11. The method of claim 10, wherein the method further comprises:
interleaving the detected data set, wherein an interleaved data set is generated, and wherein the interleaved data set is the derivative of the detected data set.

12. The method of claim 10, wherein the detected data set is a detected data set of interest, wherein the decoded data set is a decoded data set of interest, wherein the input data set is a data set of interest, and wherein the method further comprises:
performing a data detection on an excess data set using the first detector, wherein an excess detected data set is generated;
decoding a derivative of the excess detected data set, wherein an excess decoded data set is generated;
determining that the excess data set is not a data set of interest; and
based at least in part on said determination that the excess data set is not a data set of interest, providing the excess decoded data set as an output regardless of whether the excess decoded data set converged.

13. The method of claim 12, wherein the method further comprises:
interleaving the excess detected data set, wherein an excess interleaved data set is generated, and wherein the excess interleaved data set is the derivative of the excess detected data set.

14. The method of claim 12, wherein providing the excess decoded data set as an output regardless of whether the excess decoded data set converged limits a number of processor iterations applied to the excess decoded data set.

15. The method of claim 12, wherein the output is provided to a reorder buffer, and wherein providing the excess decoded data set as an output regardless of whether the excess decoded data set converged reduces the amount of storage in the reorder buffer that is utilized.

16. The method of claim 10, wherein the method further comprises:
asserting an iteration enable signal based upon the determination of whether the input data set is a data set of interest.

17. A data processing system, the data processing system comprising:
a first detector circuit, wherein the first detector circuit is operable to perform a data detection on an excess data set at a first time to generate an excess detected data set, and on a data set of interest at a second time to generate a detected data set of interest;
a second detector circuit;
a data decoder, wherein the data decoder is operable to receive a derivation of the excess detected data set and to provide a corresponding excess decoded data set, and wherein the data decoder is operable to receive a derivation of the detected data set of interest and to provide a corresponding decoded data set of interest;
wherein the data decoder is operable to provide the decoded data set of interest for processing by the second detector circuit at a third time; and
wherein the data decoder is operable to provide the excess decoded data set to an output data buffer regardless of convergence of the excess decoded data set.

18. The data processing system of claim 17, wherein the data decoder is operable to provide the decoded data set of interest to an output data buffer upon convergence of the decoded data set of interest.

19. The data processing system of claim 17, wherein providing the excess decoded data set to the output data buffer regardless of convergence of the excess decoded data set limits a number of processor iterations applied to the decoded data set.

20. The data processing system of claim 17, wherein providing the excess decoded data set to the output data buffer regardless of convergence of the excess decoded data set reduces the amount of storage in the output data buffer that is utilized.

* * * * *